(12) United States Patent
Hata et al.

(10) Patent No.: US 7,939,938 B2
(45) Date of Patent: May 10, 2011

(54) FUNCTIONAL DEVICE PACKAGE WITH METALLIZATION ARRANGEMENT FOR IMPROVED BONDABILITY OF TWO SUBSTRATES

(75) Inventors: Shohei Hata, Yokohama (JP); Naoki Matsushima, Yokohama (JP); Eiji Sakamoto, Fujisawa (JP); Ryoji Okada, Kasumigaura (JP); Takanori Aono, Moka (JP); Atsushi Kazama, Moka (JP); Toshiki Kida, Kumagaya (JP)

(73) Assignee: Hitachi Metals, Inc., Tokyo (JP)

( * ) Notice: Subject to any disclaimer, the term of this patent is extended or adjusted under 35 U.S.C. 154(b) by 203 days.

(21) Appl. No.: 12/028,108

(22) Filed: Feb. 8, 2008

(65) Prior Publication Data
US 2008/0217752 A1    Sep. 11, 2008

(30) Foreign Application Priority Data
Mar. 6, 2007    (JP) .................. 2007-055860

(51) Int. Cl.
*H01L 23/04* (2006.01)
(52) U.S. Cl. ........ 257/730; 257/687; 257/685; 257/710
(58) Field of Classification Search ............... 257/686, 257/730, 710, 687, 685
See application file for complete search history.

(56) References Cited

U.S. PATENT DOCUMENTS

| | | | |
|---|---|---|---|
| 6,570,251 B1 * | 5/2003 | Akram et al. | 257/738 |
| 6,933,537 B2 | 8/2005 | Yee et al. | |
| 6,953,990 B2 | 10/2005 | Gallup et al. | |
| 7,576,427 B2 * | 8/2009 | Potter | 257/710 |
| 2004/0106294 A1 | 6/2004 | Lee et al. | |
| 2007/0045848 A1 | 3/2007 | Tai et al. | |
| 2008/0268576 A1 | 10/2008 | Fukaya et al. | |

FOREIGN PATENT DOCUMENTS

| | | |
|---|---|---|
| CN | 1507023 | 6/2004 |
| CN | 1638111 | 7/2005 |
| JP | 10-242315 | 9/1998 |
| JP | 10-247695 | 9/1998 |
| JP | 10-253856 | 9/1998 |
| JP | 10-303323 | 11/1998 |
| JP | 2002-246492 | 8/2002 |

(Continued)

OTHER PUBLICATIONS

Office Action in Korean Patent Appln. No. 10-2008-11754, mailed May 20, 2009 (in Korean).

*Primary Examiner* — Marcos D. Pizarro
*Assistant Examiner* — Eva Y Montalvo
(74) *Attorney, Agent, or Firm* — Antonelli, Terry, Stout & Kraus, LLP.

(57) ABSTRACT

A packaging structure for hermetically sealing a functional device by solder connection at a wafer level in which a first Si substrate having a concave portion metallized on its internal surface and a second Si substrate metallized at a position opposed to said concave portion are used, the metallization applied to the internal surface of the concave portion of the first Si substrate and the metallization applied to the second Si substrate at the position opposed to the concave portion are connected by molten solder to hermetically seal the functional device between the first Si substrate and the second Si substrate, whereby the wettability of the solder for the two Si substrates is improved, the bondability between the Si substrates is enhanced, and the yield at which the package is manufactured is improved.

11 Claims, 7 Drawing Sheets

FOREIGN PATENT DOCUMENTS

| | | |
|---|---|---|
| JP | 2004-235440 | 8/2004 |
| JP | 2004-288737 | 10/2004 |
| JP | 2004-327562 | 11/2004 |
| JP | 2005-236159 * | 2/2005 |
| JP | 2005-094019 | 4/2005 |
| JP | 2005-236159 | 9/2005 |
| JP | 2006-032492 | 2/2006 |
| WO | WO 03/030275 | 4/2003 |

* cited by examiner

SIDE SURFACE OF CONCAVE
(CONVEX) PORTION

FUNCTIONAL DEVICE PACKAGE WITH METALLIZATION ARRANGEMENT FOR IMPROVED BONDABILITY OF TWO SUBSTRATES

The present application claims priority from Japanese application JP2007-055860 filed on Mar. 6, 2007, the content of which is hereby incorporated by reference into this application.

BACKGROUND OF THE INVENTION

1. Field of the Invention

The present invention relates to a functional device package for various kinds of sensors, actuators, etc. manufactured by processing through etching an Si substrate (the Si substrate includes here and hereinafter an Si wafer, $SiO_2$, or a wafer having an $Si/SiO_2/Si$ sandwich structure in which an $SiO_2$ insulation layer is disposed on the inside) based on MEMS (micro electro mechanical systems) technology or the like.

2. Description of the Related Art

Functional devices such as various kinds of sensors, high frequency filters, and mirror functional devices have been manufactured by using the MEMS technology. For example, in an acceleration sensor, a structure including a weight is generally formed by using an etching technique, and acceleration that exerts on the weight can be read by reading an electrostatic capacitance change in an electrode connected to the weight or a resistance change of a strain detection device formed on a thin beam connected to the weight. In a high-frequency filter, for example, of a structure referred to as FBAR (film bulk acoustic resonator), a cavity is formed on an Si substrate, and an AlN piezoelectric film sandwiched between electrodes is formed so as to override the cavity. In a mirror device, a mirror portion of Si is driven, and an optical channel is adjusted to form images. Any of the MEMS functional devices includes movable portions such as a weight, a piezoelectric film, or a mirror. Operation characteristics of such movable portions are naturally influenced by the effect of an atmosphere surrounding them. Accordingly, it is necessary to keep an air pressure constant in a space where the movable portion is present, thus necessitating hermetic sealing.

Heretofore, to take out an electric signal from a functional device to the outside under the hermetic sealing, a package and a cover both made of ceramics have been used. In the ceramic package, electrode pads for connecting wire bonding are formed on the inside, and wiring connected to the electrode pads is taken out from the inside of the ceramic package to its outside so as not to cause leakage. On the outside of the ceramic package, electrode pads connected with the wiring led out of the inside are formed.

However, a demand for reducing the size and lowering the cost has been increasing in recent years, and packaging at a wafer level has become necessary as means for satisfying the demand. Packaging at the wafer level refers to a method of connecting another wafer for sealing to a wafer on which various functional devices are formed to complete packaging. Since functional devices as many as several thousands or several tens of thousands can be sealed collectively by the connection of the wafers, this is advantageous in terms of decreasing the cost. Further, a sealing portion can be designed precisely by photolithography, this is also advantageous in terms of the size reduction of the package.

As an example of means for connecting wafers, while several new methods such as Si—Si direct connection and anodic bonding between a glass wafer and Si have been presented, solder connection can be given, which is a proven connecting method conventionally used for packaging semiconductor parts.

As the techniques disclosed thus far, description is to be made on two methods, that is, a method of packaging a functional device by solder connection although not at a wafer level and a packaging method by soldering at a wafer level.

The following JP-A-10-303323 describes a package structure which is particularly suitable to a package for hermetically sealing a high frequency IC that forms an oscillation circuit and which can maintain required hermetic sealing with a sufficient adhesion strength even when the thickness of the cap is increased as a vibration countermeasure to increase the connection area with a header. As the method, double circular recessed grooves are formed in the inner circumference and the outer circumference of the connection surface of the header to be connected to the cap, the header for the inner connection portion surrounded with the circular recessed grooves in the inner and the outer circumferences and the cap are welded by a brazing material, and the header for the outer connection portion more external than the circular recessed groove in the outer circumference and the cap are welded by laser welding. Further, it is shown that the circular recessed grooves in the inner and the outer circumferences formed on the bonding portion are grooves for preventing the flow of the brazing material to the high frequency IC portion.

Further, JP-A-2004-235440, with a view to providing a micropackage in which wafers of a large diameter are favorably connected, discloses a method of hermetically sealing a device wafer in which a plurality of active portions of a microsensor or a microactuator are formed on the wafer and a cover member at the periphery of each active portion of the device wafer by a connection portion. It is disclosed that solder is used for the connection.

SUMMARY OF THE INVENTION

JP-A-10-303323 is characterized in that circular recessed grooves are formed in inner and outer circumferences of connection portions of a header and a cap thereby suppressing bleeding of a brazing member. However, it is not considered to attain hermetic sealing of a functional device by the connection with the wettability of the connecting material ensured at a wafer level.

Further, in JP-A-2004-235440, solder connection is conducted at a wafer level to attain packaging, but sufficient consideration is not taken as to ensuring the wettability of solder for attaining hermetic sealing at a high yield. In the packaging of a microsensor or a microactuator, it is generally difficult to use a flux for preventing intrusion of dust or foreign particles during solder bonding. Accordingly, it is necessary to conduct solder bonding while attaining sufficient wetting of the solder in a fluxless manner.

The present invention is intended to overcome the problems described above.

The present invention provides a functional device package including:

a functional device;

a first Si substrate formed a concave portion on an internal surface of which metallization is applied; and a second Si substrate to which metallization is applied at a position opposed to the concave portion, wherein the metallization applied on the internal surface of the concave portion formed on the first Si substrate and the metallization applied at the position of the second Si substrate opposed to the concave portion are connected by melting solder, and the first Si substrate and the second Si substrate are connected so as to hermetically seal the functional device.

In the functional device package described above, the functional device is formed on the first Si substrate in such a way to be surrounded by the concave portion.

In the functional device package described above, the functional device is formed on the second Si substrate in such a way to be surrounded by the metallization applied at the position opposed to the concave portion.

In the functional device package described above, the concave portion is formed in plurality of rows.

In the functional device package described above, the concave portion is a V-shaped groove, and an angular convex portion is formed by lateral sides of adjacent concave portions.

In the functional device package described above, a depth of the concave portion is from several μm to 20 μm.

In the functional device package described above, the solder is a solder material containing, as a main ingredient, such an alloy as Au—Sn, Sn—Ag, Sn—Cu, Sn—Ag—Cu, Sn—Zn, Sn—Pb, and Sn—Bi.

In the functional device package described above, metallization is formed on an outside of the concave portion on the surface of the first Si substrate, and the metallization formed on the internal surface of the concave portion and the metallization formed on the outside of the concave portion on the surface of the first Si substrate are connected.

In the functional device package described above, the metallization on the internal surface of the concave portion of the first Si substrate, the metallization on the outside of the concave portion on the surface of the first Si substrate, and the metallization applied at the position of the second Si substrate opposed to the concave portion are connected to each other by melting solder, and the first Si substrate and the second Si substrate are connected so as to hermetically seal the functional device.

In the functional device package described above, the metallization has a constitution in which a thin film containing at least one of Ni, Cu, Pt, and Pd for suppressing reaction with the solder is formed on surface of a thin film containing at least one of metals such as Ti, Cr, W and V formed as an adhesion layer with the Si substrate and an Au film for antioxidation is further formed on the surface thereof.

In the functional device package described above, the first Si substrate and the second Si substrate are Si wafers or wafers of an Si/SiO$_2$/Si sandwich structure having an SiO$_2$ insulation layer on inside.

Further, the invention provides a functional device package having a package structure formed by stacking two sheets of Si substrates on either of which a plurality of functional devices are formed, bonding them with solder to conduct hermetical sealing at a wafer level and then cutting and separating them into individual pieces, and having:

an Si substrate on side of the functional devices provided with a concave portion formed continuously in one or a plurality of rows so as to surround the separated one functional device and on a surface of which concave portion metallization is applied; and an Si substrate on side of a cover to which metallization is applied on surface opposed to a region in which the concave portion is formed when stacked with the Si substrate on the side of the functional devices, wherein a portion between the metallized surface of the concave portion provided on the Si substrate on the side of the functional devices and the metallized surface of the Si substrate on the side of the cover opposed to the region in which the concave portion is formed is connected by solder so as to hermetically seal the one functional device.

Further, the invention provides a functional device package having a package structure having:

an Si substrate on the side of a functional device having a functional device and provided with a concave portion formed so as to surround the functional device and on a surface of which concave portion metallization is applied;

an Si substrate on side of a cover on which metallization is applied on a surface at a position opposed to the concave portion of the Si substrate on the side of the functional device;

a first electrode metallization of a concave shape electrically connected with the functional device and disposed at an inside position of the concave portion on the Si substrate on the side of the functional device;

a second electrode metallization disposed at a position on the Si substrate on the side of the cover opposed to the first electrode metallization; and a through hole formed at a position of the Si substrate on the side of the cover opposed to the first electrode metallization in such a way to penetrate the cover-side Si substrate, wherein a portion between the metallized surface of the concave portion provided on the Si substrate on the side of the functional device and the metallized surface of the Si substrate on the side of the cover opposed to the region in which the concave portion is formed is connected by solder, and a portion between the first electrode metallization provided on the Si substrate on the side of the functional device and the second electrode metallization provided on the Si substrate on the side of the cover is further connected by solder, so as to hermetically seal the functional device.

Further, the invention provides a functional device package having a package structure formed by stacking two sheets of Si substrates on either of which a plurality of functional devices are formed, connecting them with solder to hermetically seal at a wafer level, and then cutting and separating the same into individual pieces and having:

an Si substrate on side of the functional device on a surface of which metallization is formed continuously so as to surround the one separated functional device; and an Si substrate on side of a cover provided with a concave portion formed in one row or a plurality of rows on a surface opposed to a region in which the metallization is applied when stacked with the Si substrate on the side of the functional device and on a surface of which concave portion metallization is applied, wherein a portion between the metallization provided on the Si substrate on the side of the functional device and the concave portion formed in one row or a plurality of rows on the surface of the Si substrate on the side of the cover opposed to the region in which the metallization is applied, on the surface of which concave portion the metallization is applied, is connected by solder so as to hermetically seal the one functional device.

Further, the invention further provides a functional device package having a packaging structure including:

an Si substrate on side of a functional device having a functional device and on a surface of which metallization is applied continuously so as to surround the functional device, an Si substrate on side of a cover provided with a metallized concave portion at a position opposed to the metallization on the surface of the Si substrate on the side of the functional device, a first electrode metallization electrically connected with the functional device and provided at an inside position of the metallization on the Si substrate on the side of the functional device, and a through hole formed on the Si substrate on the side of the cover at a position opposed to the first electrode metallization in such a way to penetrate the Si substrate on the side of the cover, a continuous concave portion surrounding the through hole, and a second electrode metallization covering at least the surface of the concave portion, wherein a portion between the metallization provided on the Si substrate on the side of the functional device and the concave portion on the Si substrate on the side of the cover to the surface of which metallization is applied at a position opposed to the metallization is connected by solder, and a portion between the first electrode metallization provided on the Si substrate on the side of the functional device and the second electrode metallization provided on the Si substrate on the side of the cover is further connected by solder, so as to hermetically seal the functional device.

The present invention can provide a functional device package capable of hermetically sealing functional devices based on MEMS or the like collectively in a state of wafer and having high reliability and of a low cost.

DETAILED DESCRIPTION

Preferred embodiments of the present invention are to be described with reference to the drawings.

Embodiment 1

Figure 1:
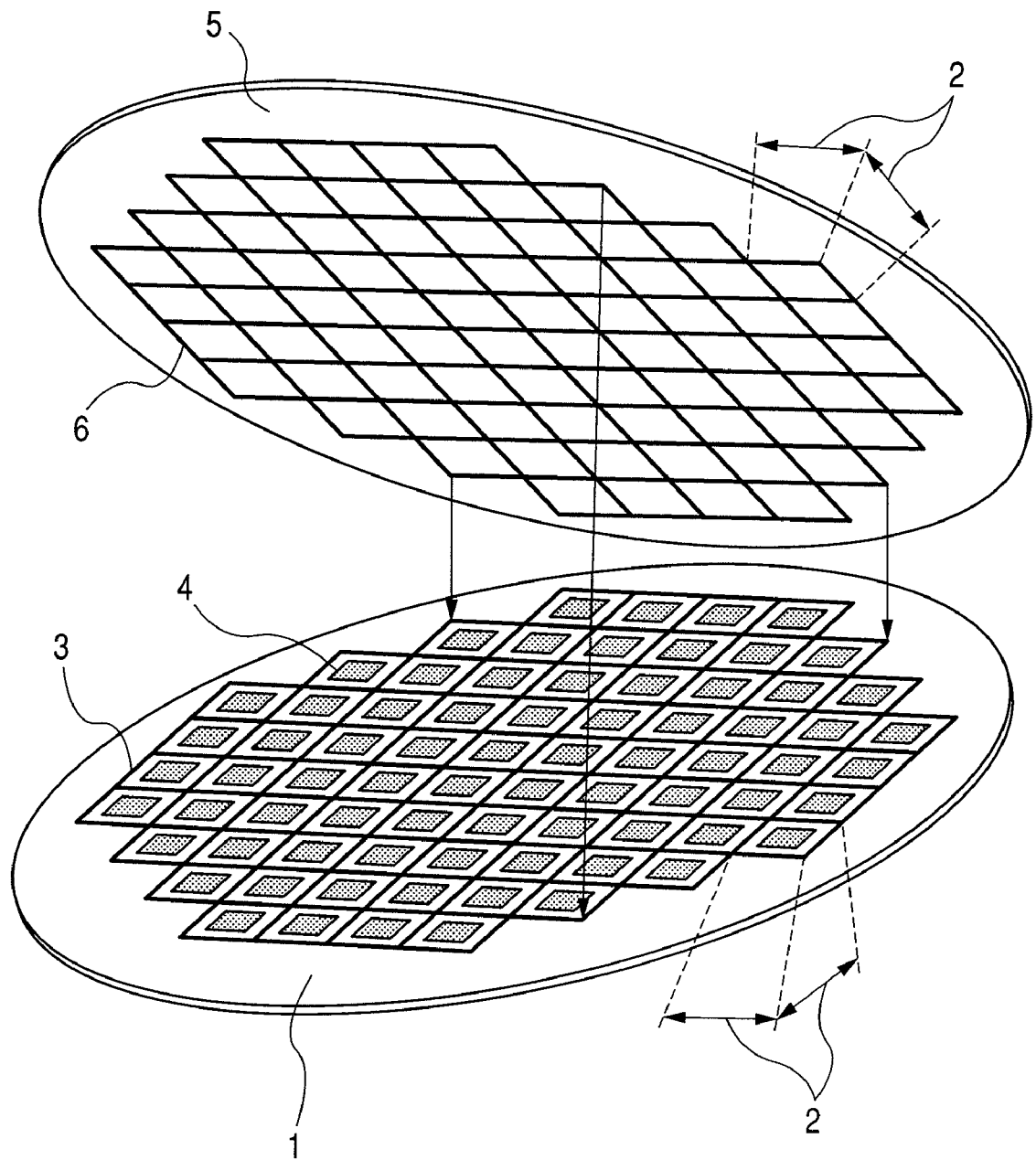
FIG. 1 is a schematic view for connection in a wafer state according to an embodiment of the invention.

A first embodiment of the invention is to be described with reference to FIG. 1 and FIGS. 2A to 2D. FIG. 1 is a schematic view for connection in a wafer state showing the state of conducting hermetic sealing at a wafer level. FIGS. 2A to 2D are detailed cross-sectional structural views showing a connection process for a hermetic seal portion.

In FIG. 1, reference numeral 2 denotes a functional device pattern for one piece of the functional device. A hermetic seal portion 3 (on the side of the functional device) is formed in the outer circumference of a functional device 4 provided on an Si substrate 1 (on the side of the functional devices). On the other hand, on an Si substrate 5 (on the side of a cover), a hermetic seal portion 6 (on the side of the cover) is formed at an opposed position so as to be connected with the hermetic seal portion 3 (on the side of the functional device). The Si substrate 1 (on the side of the functional devices) and the Si substrate 5 (on the side of the cover) are positioned such that the hermetic seal portions thereof are stacked and they are provisionally fixed to a jig by clamping or screwing. The jig is set in a chamber of a connecting apparatus, a load at about several 1,000 N to 10,000 N (several 100 kgf to 1020 kgf) is applied to the entire substrates, and solder is melted to conduct connection by heating it to a melting point or higher, which is formed on the hermetic seal portions, thereby enabling hermetic sealing at a wafer level. After the hermetic sealing at the wafer level, the functional devices are cut and separated into individual pieces to manufacture a functional device package having a structure in which the functional device 2 is packaged as an individual product.

In this case, when an Si wafer or a wafer of an Si/SiO$_2$/Si sandwich structure having an SiO$_2$ insulation layer on the inside is used selectively as the Si substrate in accordance with the required characteristics of the Si substrate, the cost can be decreased further.

Next, a detailed structure of the hermetic seal portion is to be described specifically in conjunction with the connection process thereof with reference to FIGS. 2A to 2D. First of all, the state before connection is to be described with reference to FIG. 2A. On an Si substrate 1 (on the side of the functional device), concave portions 25 are formed with the use of pattern formation by photolithography and the method of dry etching or wet etching. In the case of a single crystal Si wafer, it can be considered that the lower surface of the concave portion forms a curved surface. However, since the specifics of the shape at the lower surface of the concave portion have no significant influence on the effect of this embodiment, the concave portion of a curved shape is also included in this embodiment. Further, the concave portion has vertical side surfaces; on occasion, they are somewhat slanted, for example, by the effect of side etches in the etching step, and they are also included in this embodiment. The concave portion having relatively vertical side surfaces and a flat bottom as in this embodiment can be formed when dry etching is conducted at a high speed by using an SOI (Silicon On Insulator) substrate used frequently in MEMS.

Figure 2A:
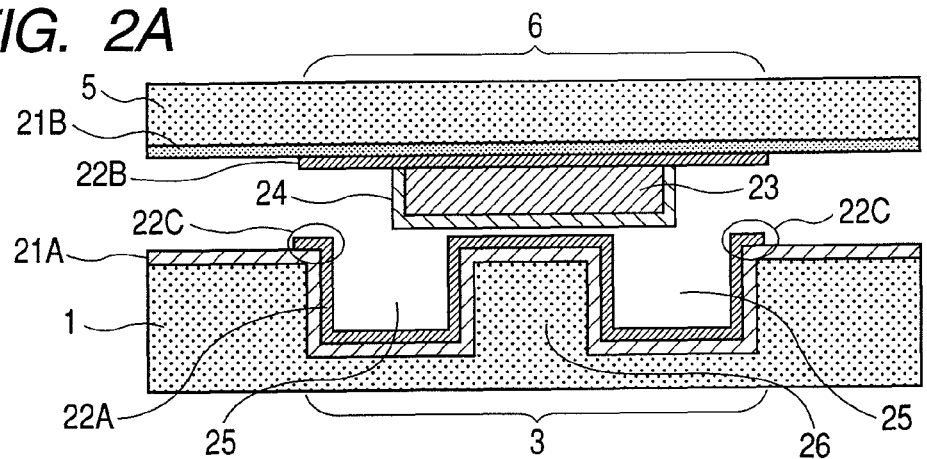
FIGS. 2A to 2D are detailed cross-sectional structural views showing a connection process for a hermetic seal portion according to the embodiment of the invention.

In this embodiment, two rows of the concave portions 25 are formed in the outer circumference of a functional device, and FIG. 2A shows a cross section of a portion thereof. While the depth of the concave portion 25 has to be designed depending on the thickness and the volume of a solder film 23, a depth of about several μm to 20 μm is generally preferred. After the concave portion 25 is formed, treatment such as thermal oxidation is applied to the Si substrate 1 (on the side of the functional device) to form an Si oxide film 21A. The Si oxide film 21A is generally formed for insulating the surface of the Si substrate 1 (on the side of the functional device) with a view to preventing an electric short circuit between wires on the wafer in the case of forming functional devices and hence shown in the diagram. However, this has no particular effect on the connection, and the Si oxide film 21A may not be formed when only hermetic sealing is intended.

Then, metallization 22A is applied to the region of the hermetic seal portion 3 (on the side of the functional device). For the pattern formation of the metallization 22A, two methods can be used mainly. First, one is a liftoff method of forming a resist pattern by photolithography, on which metallization is applied, and removing surplus metallization on the resist. The other is a method of first forming metallization on the Si oxide film 21A, coating a resist thereon, forming a resist pattern by photolithography, and removing the metallization at the opening portion of the resist pattern by milling.

Alternatively, the metallization at the opening portion of the resist can also be removed by wet etching instead of milling.

For example, when the metallization pattern is formed by the liftoff method, a resist pattern is formed on the outside of the concave portion 25. This is because the thickness of the resist to be exposed on the inside of the concave portion 25 is different from those in other portions, and no distinct pattern can be obtained. Further, as will be described later, it is an important point for this embodiment to provide its effects that the metallization is applied to the side surfaces of the concave portion 25 or the convex portion 26. Thus, for forming metallization reliably to the side surfaces, the resist pattern has to be formed accurately on the outside of the concave portion 25. Accordingly, the metallization 22A is always formed on the outside of the concave portion 25 and on the surface of the Si substrate 1 (on the side of the functional device) as shown by 22C in the drawing.

Also in the case of forming the metallization pattern by milling or wet etching, the metallization 22A is formed on the surface of the Si substrate 1 (on the side of the functional device) and on the outside of the concave portion 25 as shown by 22C. In those processes, while the metallization 22A is first formed over the entire surface of the Si substrate 1 (on the side of the functional device) and resist coating and formation of the resist pattern are then conducted, it is still difficult to form a distinct pattern on the inside of the concave portion 25. Unless the resist pattern is left as far as the outside of the concave portion 25, ions upon milling or solutions of wet etching may intrude as far as the inside of the concave portion 25 to result in an extremely high possibility of removing metallization on the side surfaces of the concave portion 25 and the convex portion 26. Accordingly, also in those processes, the metallization 22A is always to be formed continuously on the outside of the concave portion 25 and at a portion on the surface of the Si substrate 1 (on the side of the functional device) as shown by 22C.

Next, the constitution of the metallization 22A is to be described. For the metallization 22A, a thin film containing at least one of such metals as Ti, Cr, W, and V is formed as an adhesion layer with the Si oxide film 21A by sputtering or vapor deposition. The thickness is preferably about 0.1 μm to 0.3 μm. A thin film of such a metal as Ni, Cu, Pt, and Pd is formed on the adhesion layer as a protection film for the adhesion layer. The thickness is preferably from 0.2 μm to 0.5 μm. Also in this process, while sputtering or vapor deposition can be used, a plating method is also applicable in the case of Ni or Cu metallization. The thickness of the protection film tends to be decreased in the case of sputtering or vapor deposition and increased relatively in the case of plating. Finally, an Au film is formed on the top surface. While Au metallization can also be formed by sputtering or vapor deposition, electroplating or electroless plating can also be conducted in addition. The thickness of Au is preferably from 0.2 to 0.5 μm in the case of sputtering or vapor deposition and 0.1 to 0.3 μm in the case of plating.

When all of the steps are conducted by sputtering or vapor deposition, film deposition is generally conducted in a continuous manner without taking out the substrates into atmospheric air after putting them into a film deposition apparatus. In the case of using the plating method, a common case is that a metal of the adhesion layer such as Ti, Cr, W, and V is first formed by sputtering or vapor deposition, and subsequently the protection film and the surface Au film are formed by plating.

Also for the Si substrate 5 (on the side of the cover), metallization 22B is formed on an Si oxide film 21B in the same manner as in the Si substrate 1 (on the side of the functional device). Further, a solder film 23 is formed.

Applicable to the method of forming a solder film is a method of forming a resist pattern by photolithography, depositing a solder film by a method such as vapor deposition and sputtering, and then forming a solder pattern by the liftoff method. In addition, the solder film 23 may also be formed by printing a solder paste using a screen mask or a metal mask and applying solder reflow on the entire Si substrate 5 (on the side of the cover). Alternatively, it can also be formed by applying solder plating on the metallization 22. Further, a method of directly blowing fine particles of molten solder to the metallization by a method referred to as a melt discharging method to form a solder film is also applicable.

For the metal that can be used as the solder, those solder materials used generally for mounting electronic parts, for example, Au-20 to 37.6 Sn (wt %), Au-90Sn, Sn-9Zn, Sn-3.5Ag, Sn-3Ag-0.5Cu, Pb-5Sn, Pb-10Sn, Sn-37Pb, and Sn-57Bi, can be applied. The solder composition is not limited to them but also includes those containing a micro amount of alloy elements or those of somewhat different compositions.

The above-mentioned solder composition is to be described. In Au—Sn binary-system solder, Au-20Sn eutectic crystals are generally used. However, in the connection using a micro amount of solder as in this embodiment, a solder composition has to be designed with reaction between the solder and the metallization taken into account. That is, since Au is present on the surface of the metallization 22A or metallization 22B, the wettability of the solder sometimes changes by dissolution of Au into the solder. Generally, the wettability is lowered as the composition of the solder approaches a more Au-rich level than in Au-20Sn. Accordingly, it is effective to shift the composition to the side of Sn by that amount, which is possible up to Au-37.6Sn within a range in which eutectic reaction is included at Au-20Sn. The solder connection temperature is selected generally in a range from 280° C. (eutectic temperature) to about 350° C.

Other compositions than those described above, for example, Au-90Sn, Sn-9Zn, Sn-3.5Ag, and Sn-3Ag-0.5Cu, generally show the bonding temperature within a range about from 220° C. to 260° C. Since such solders originally contain much Sn, no detailed composition design against the dissolution of Au such as the solder of a composition near Au-20Sn is generally necessary.

Pb-5Sn and Pb-10Sn are high melting solders rich in Pb; connection using those is conducted at a temperature of about 300° C. While it is possible to apply such solder materials, use of the Pb-containing solder is not desirable in light of the Pb-free trend for the environment.

Sn-37Pb has a connection temperature of about 220° C., and it was one of the most popular solders in the past. Accordingly, while this solder is applicable, it is also not desirable in view of the Pb-free trend.

Sn-57Bi is a low melting solder with a melting point at about 138° C. This can lower the connection temperature to about 160 to 180° C. While this has a merit of moderating the thermal effect to the functional device, a mounting design is necessary in which the heat resistance property of the solder-connected portion is taken into account upon mounting the packaged functional device on electronic equipment.

While the solder materials have just been explained above, they have a common problem. Generally, when the solder film 23 in FIG. 2A is formed, an oxide film of Sn or alloy elements are often formed on its surface. That is an oxide film 24. The oxide film 24 causes wetting failure in fluxless connection.

As has been described previously, solder connection with hermetic sealing of an MEMS functional device is conducted based on a complete fluxless condition. Accordingly, it is necessary to avoid the wetting failure caused by the oxide film 24.

As a countermeasure, in this embodiment, the Si substrate 1 (on the side of the functional device) and the Si substrate 5 (on the side of the cover) are accurately positioned, fixed provisionally, and then set above a heater in a chamber, and the atmosphere is evacuated or filled with an inert gas. While the kind and the pressure of the atmosphere are determined based on the characteristics of the MEMS functional device, such an atmosphere as not causing solder oxidation at least during connection is to be considered. This is shown in FIG. 2A.

Figure 2B:
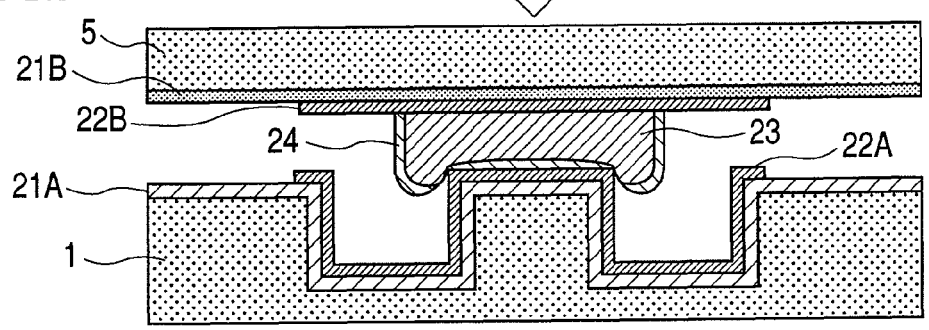

Then, an edge formed by the concave portion 25, that is, an upper surface including corner portions of the convex portion 26 in this embodiment, is forced onto the solder film 23. First, a load of several 1,000N to 10,000N (several 100 to 1,020 kgf) is applied in the direction of the arrow in the diagram before melting of solder to press the convex portion 26 into the solder film 23. In this process, the oxide film 24 is broken. Since the atmosphere is inert, the broken portion of the oxide film is not oxidized. This is shown in FIG. 2B.

Figure 2C:
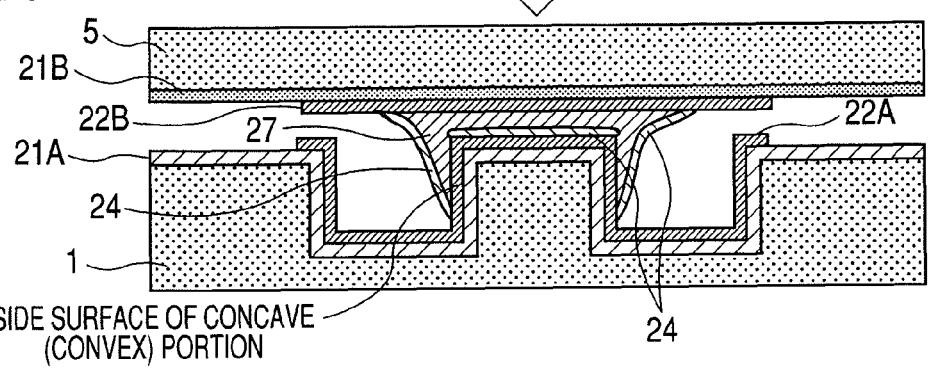

Further, heating is applied up to a temperature above the melting point of the solder with the load applied. The solder is melted, and molten solder 27 spreads by wetting into the metallizations 22A and 22B. This is shown in FIG. 2C.

Figure 2D:
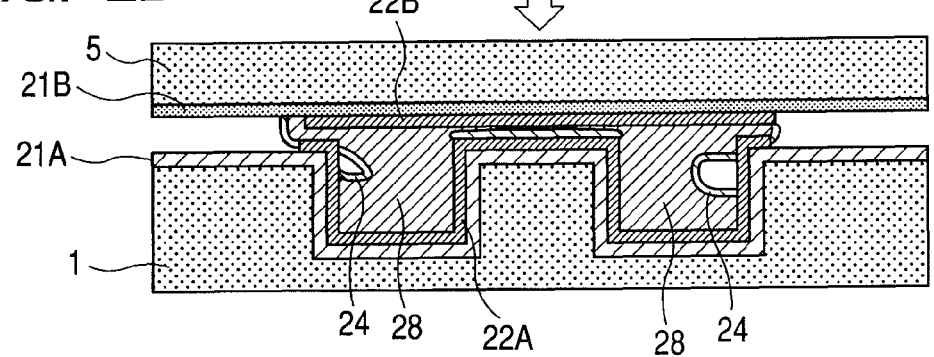

The oxide film 24 present originally above the convex portion 26 is sometimes left partially on the inside of the solder connection portion, but the better part of the oxide film 24 present originally on the solder surface is not absorbed into the solder but discharged out of the solder in the process where the solder spreads by wetting onto the side surfaces of the convex portion 26. Since the specific gravity of the oxide film is less than that of the solder, the oxide film is not precipitated into the solder. Since the concave portions and the convex portion therebetween are formed so as to surround the outer circumference of the MEMS functional device, a hermetic seal structure with continuous solder is formed in the outer circumference of the MEMS functional device by the solder wet-spreading onto the side surfaces of the concave portion (convex portion). This can provide a reliable hermetic sealing of the functional device by the connection which ensures the wettability of the connecting materials at a wafer level. This is shown in FIG. 2D.

One of the reasons the wettability of the solder is thus enhanced in the structure of this embodiment is that the solder spreads by wetting while forming a fillet in a region surrounded by the edge of the concave portion 25 (also the edge of the convex portion 26 in this embodiment) and by the metallization 22A, in addition to the reason described above. In such a region surrounded by metallization, the solder tends to easily spread by wetting by a so-called capillary phenomenon due to the surface tension of the solder. Accordingly, since such a fillet is formed along the edges of the concave portions surrounding the functional device, hermetic sealing can be conducted at a high yield. For proactively causing the formation of the fillet, it is an essential condition that the metallization is applied to the side surfaces of the concave portion 25 and the convex portion 26. For this purpose, it is necessary, in the first place, to form the metallization as far as the outside of the concave portion 25 upon forming the metallization as shown by 22C. As a result, since the solder spreads by wetting during connection as far as the position of the metallization 22A on the outside of the concave portion 25, that is, 22C, as shown in FIG. 2D, reliable hermetic sealing for the functional device at the wafer level can be attained.

While the circular concave groove is used in JP-A-10-303323 for preventing bleeding of the brazing material, the concave portion 25 in this embodiment is not formed for preventing the bleeding of the brazing material, that is, the solder material. The purpose of forming the concave portion and the convex portion is to attain hermetic sealing at a high yield by utilizing the formation of the solder fillet by forming the metallization also on the side surfaces of the concave and convex portions. The embodiment is also different from JP-A-10-303323 in that the solder bleeds out actually as far as the outside of the concave portion 25.

Further, in JP-A-2004-235440, while solder connection is conducted at the wafer level, wetting failure due to surface oxidation of the solder is not taken into consideration. In the functional device based on the premise of fluxless connection, the surface oxidation of the solder is a fetal factor of lowering the wettability and lowering the yield.

Accordingly, this embodiment is intended to attain a solder connection at the wafer level and a solder connection at a high yield; the principle and the structure thereof are different from those of JP-A-10-303323 and JP-A-2004-235440.

While this embodiment shows the case where the concave portions 25 are present in two rows, the concave portion 25 may be present in one row or in a larger number of rows than two. In the case of one row, the edge portion of the concave portion 25 is pressed into the solder film 23, and hermetic sealing is conducted in the process where the solder spreads by wetting onto the side surfaces of the concave portion 25. In the case where the concave portion 25 is formed by a larger number of rows, while the sealing width as a whole is enlarged, the yield of hermetic sealing is further improved.

Further, while the concave portion is formed on the Si substrate 1 (on the side of the functional device) in this embodiment, the effect of the embodiment can be obtained without problems also in the case of forming the concave portion on the Si substrate 5 (on the side of the cover) and forming the solder film on the Si substrate 1 (on the side of the functional device).

As has been described above, according to the embodiment, since the solder fillet is formed along the edge of the concave portion that surrounds the functional device, hermetic sealing can be conducted at a high yield to attain a reliable hermetic sealing for the functional device at the wafer level.

Embodiment 2

Figure 3A:
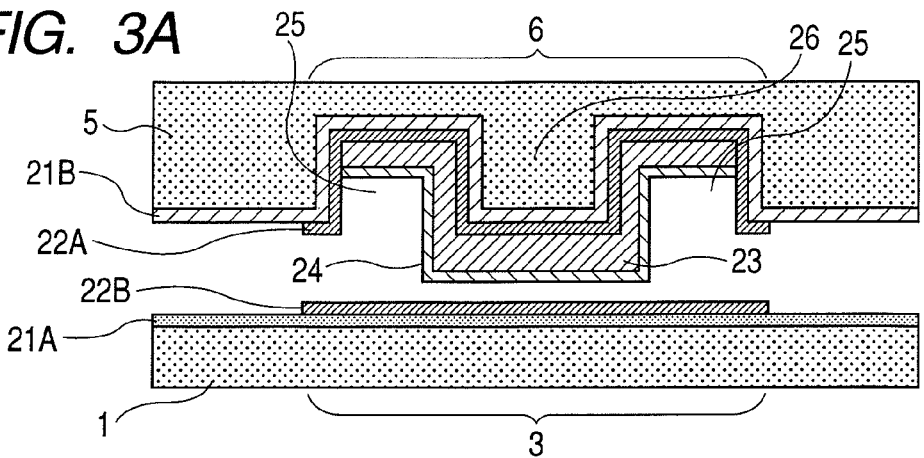
FIGS. 3A and 3D are views showing a detailed cross sectional structure of a hermetic seal portion according to another embodiment of the invention.

Next, the second embodiment of the invention is to be described with reference to FIGS. 3A to 3D. This embodiment provides a structure by forming a solder film on the inside of the concave portion for connection. As shown in FIG. 3A, concave portions 25 and a convex portion 26 are formed on an Si substrate 5 (on the side of the cover), and metallization 22A and a solder film 23 are formed on the surfaces thereof. Basically, while the solder wettability is better when an oxide film 24 is not present on the solder film 23, description of the embodiment is to be made on the case where the oxide film 24 is present on the surface of the solder film 23 though this depends on the method of forming the solder.

Since the constitution of the metallization, its formation process, the compositions of the solder, and the solder forming methods are identical with those in the first embodiment, description therefor is to be omitted.

When the solder film 23 is supplied by a method, for example, of lift off or plating, since it is difficult to accurately form a resist pattern on the inside of the concave portion 25, it can be considered that a portion of the pattern may be formed on the outside of the concave portion 25. In this case, it is expected that bleeding of the solder may be increased. Accordingly, it is desirable that the resist pattern for the solder pattern be formed so as to be preferably aligned with the side surfaces of the concave portion 25, and the solder film 23 be formed just on the bottom of the concave portion 25 and the upper surface and the side surfaces of the convex portion 26 as shown in FIG. 3A.

In the connection step, after the substrates are positioned, they are provisionally fixed by clamping, screwing, etc. and set in a chamber. The atmosphere in the chamber is made inactive. Such steps are identical with those in the first embodiment.

Figure 3B:
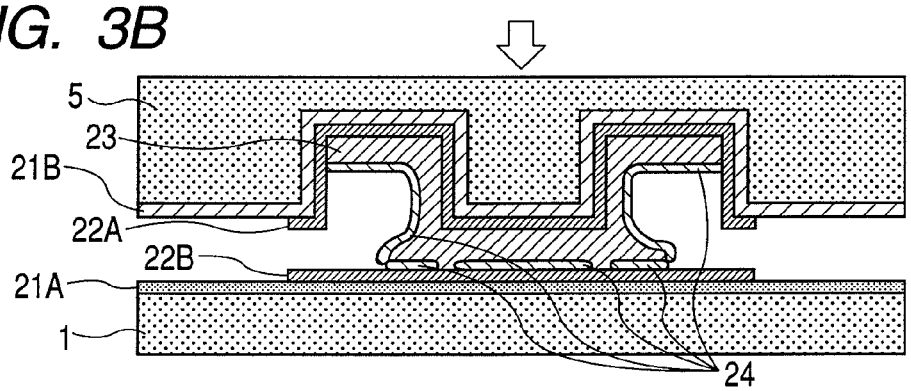

When a load is applied on the substrates before solder melting, the solder film 23 plastically deforms as shown in FIG. 3B. In the course of lateral spreading of the solder, its surface area increases, breaking the oxide film 24. Since the atmosphere is inert, no additional oxidation occurs in the portion where the oxide film 24 is broken.

Figure 3C:
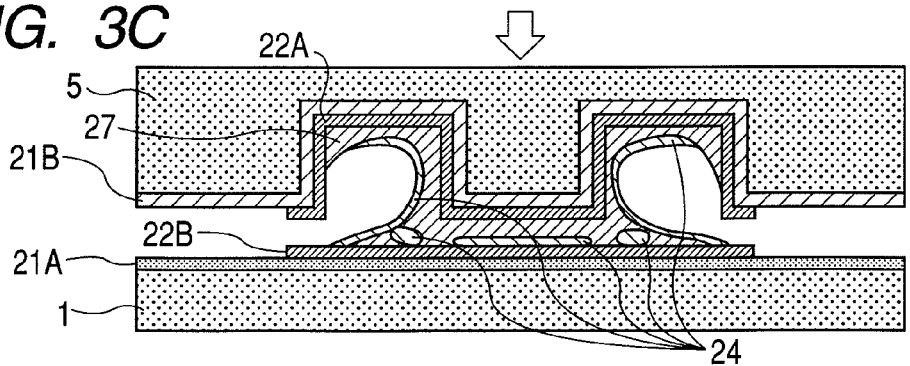
Figure 3D:
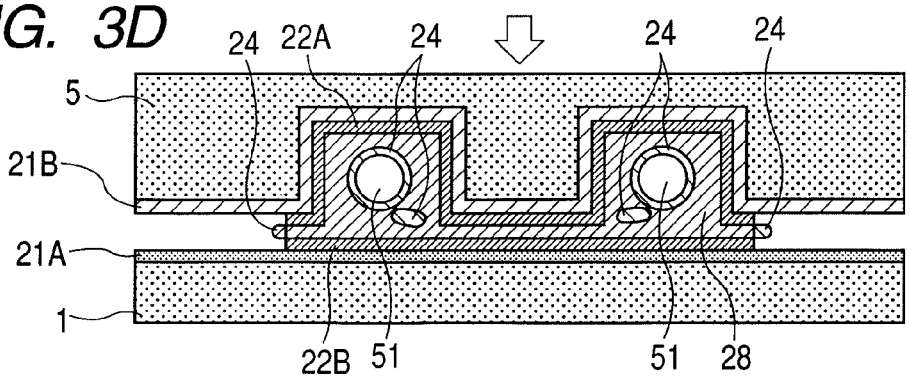
Figure 4A:
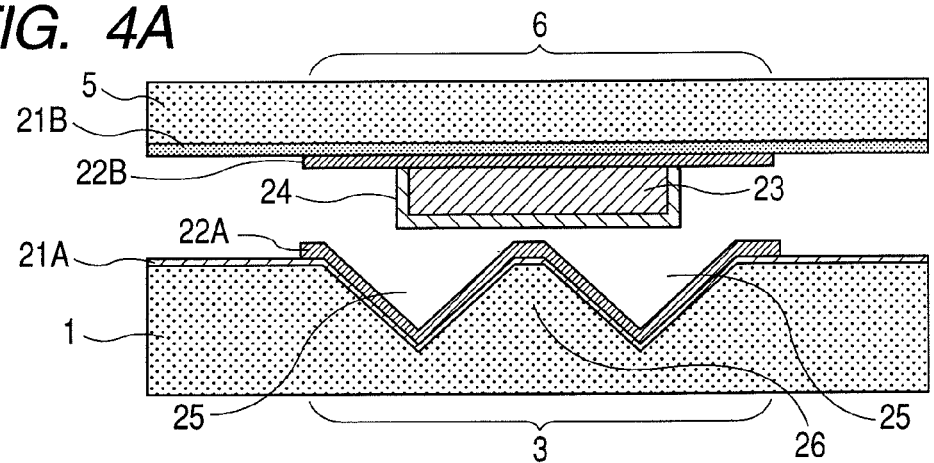
FIGS. 4A to 4D are views showing a detailed cross-sectional structure of a hermetic seal portion according to still another embodiment of the invention.
Figure 4B:
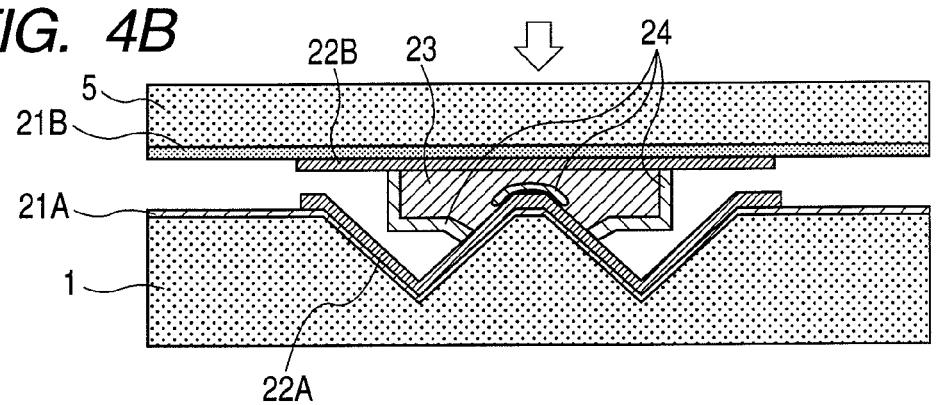
Figure 4C:
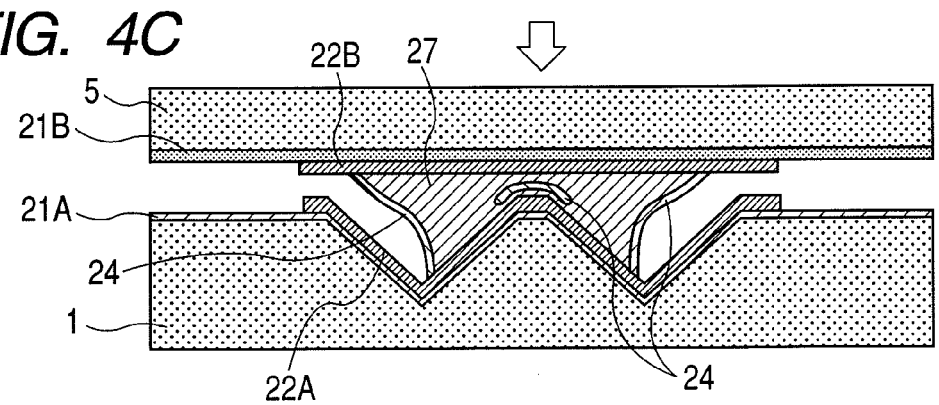
Figure 4D:
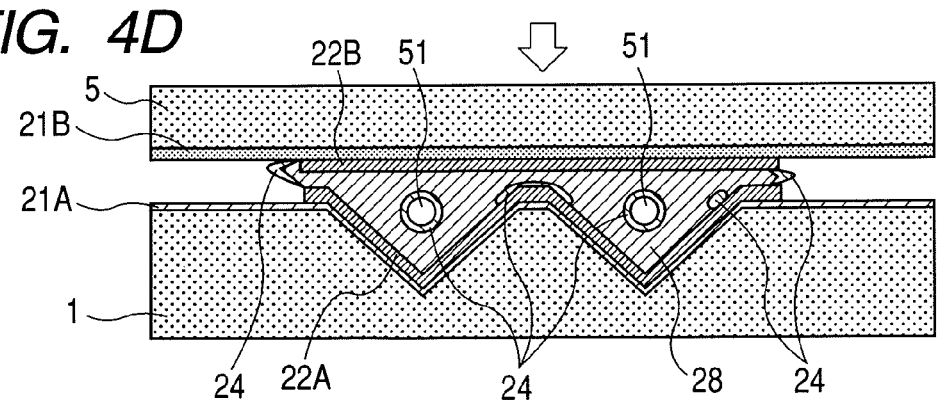

When heating is started in this state and the load is kept applied in the direction of the arrow, the solder is melted as shown in FIG. 3C, and the solder spreads by wetting from the broken portion of the oxide film 24 to the metallizations 22A and 22B. While the oxide film 24 is left partially, the inside of the concave portion can eventually be solder-connected with voids 51 left at the center of the concave portions 25; hermetic sealing can thus be conducted as shown in FIG. 3D. After the hermetic sealing at the wafer level, the functional devices are cut and separated into individual pieces to manufacture a functional device package having a package structure as an individual product.

While this embodiment shows the case where the concave portions 25 are present in two rows, the concave portion 25 may be present in one row or in a larger number of rows than two. In the case of one row, the edge portion of the concave portion 25 is indented into the solder film 23, and the hermetic sealing is conducted in the course where solder spreads by wetting on the side surfaces of the concave portion 25. In the case where the concave portions 25 are formed by a larger number of rows, while the sealing width as a whole is enlarged, the yield of the hermetic sealing is improved further.

Further, while the concave portion is formed on the Si substrate 5 (on the side of the cover), the effect of this embodiment can also be obtained with no problems at all even by forming the concave portion on the Si substrate 1 (on the side of the functional device) and forming the solder film on the Si substrate 1 (on the side of the functional device).

In addition to the effect of the Embodiment 1, the effect obtained in this embodiment is that the step for the Si substrate 1 on which the functional device is formed can be eliminated in contrast to the first embodiment by forming the concave portion for solder connection and the solder film on the Si substrate 5 on the side of the cover. When the solder film or the like is to be formed after the functional device is formed, it is difficult to form the solder film on the side of the Si substrate 1 after once forming a functional device which is not capable of withstanding the processes such as resist coating, formation of the solder film, and cleaning. Since it is necessary in such a case to form the solder film on the Si substrate 5 on the side of the cover, the structure of the embodiment is suitable.

Embodiment 3

Embodiment 3 of the invention is to be described with reference to FIGS. 4A to 4D. Since the constitution of the metallization, its formation process, the compositions of the solder, and solder forming methods are identical with those in the Embodiment 1, the description for them is to be omitted. However, the method of forming the concave portion 25 is different from those of the preceding embodiments.

As also described in the Embodiment 1, the concave portion 25 can be formed by applying dry etching or wet etching to the Si substrate 1 (on the side of the functional device). Particularly, in the case where a wafer where a (100) face of the Si substrate is exposed, wet etching exposes a close-packed (111) face to form a V-shaped groove as in this embodiment. As a result, an angular convex portion 26 is formed by the side surfaces of the adjacent concave portions. Also in this case, a portion of the oxide film 24 is broken by pressing the convex portion 26 into the solder film 23 before melting the solder as in the first and second embodiment, and a connected portion containing less of the oxide film 24 can be formed by subsequent spreading of the molten solder in a wet state whereby hermetic sealing can be performed. After the hermetic sealing at the wafer level, the functional devices are cut and separated into individual pieces to manufacture a functional device package having a package structure as an individual product.

While this embodiment shows the case where the concave portion 25 is present in two rows, the concave portion 25 may also be present in one row or in a larger number of rows than two. In the case of one row, hermetic sealing is conducted in the course where the edge portion of the concave portion 25 is indented into the solder film 23 and the solder spreads by wetting to the side surfaces of the concave portion 25. In the case where the concave portion 25 is formed in a larger number of rows, while the sealing width as a whole increases, the yield of the hermetic sealing is further improved.

Further, in this embodiment, while the concave portion is formed on the Si substrate 1 (on the side of the functional device), the effect of this embodiment can be obtained with no problems at all also when the concave portion is formed on the Si substrate 5 (on the side of the cover) and the solder film is formed on the Si substrate 1 (on the side of the functional device).

In addition to the effect obtained in the Embodiment 1, this embodiment provides an effect that since the convex portion 26 is in the angular shape and pointed at the top, it is easily indented into the solder film 23 to break the oxide film 24. Accordingly, connection can be conducted at a relatively low load.

Embodiment 4

Figure 5:
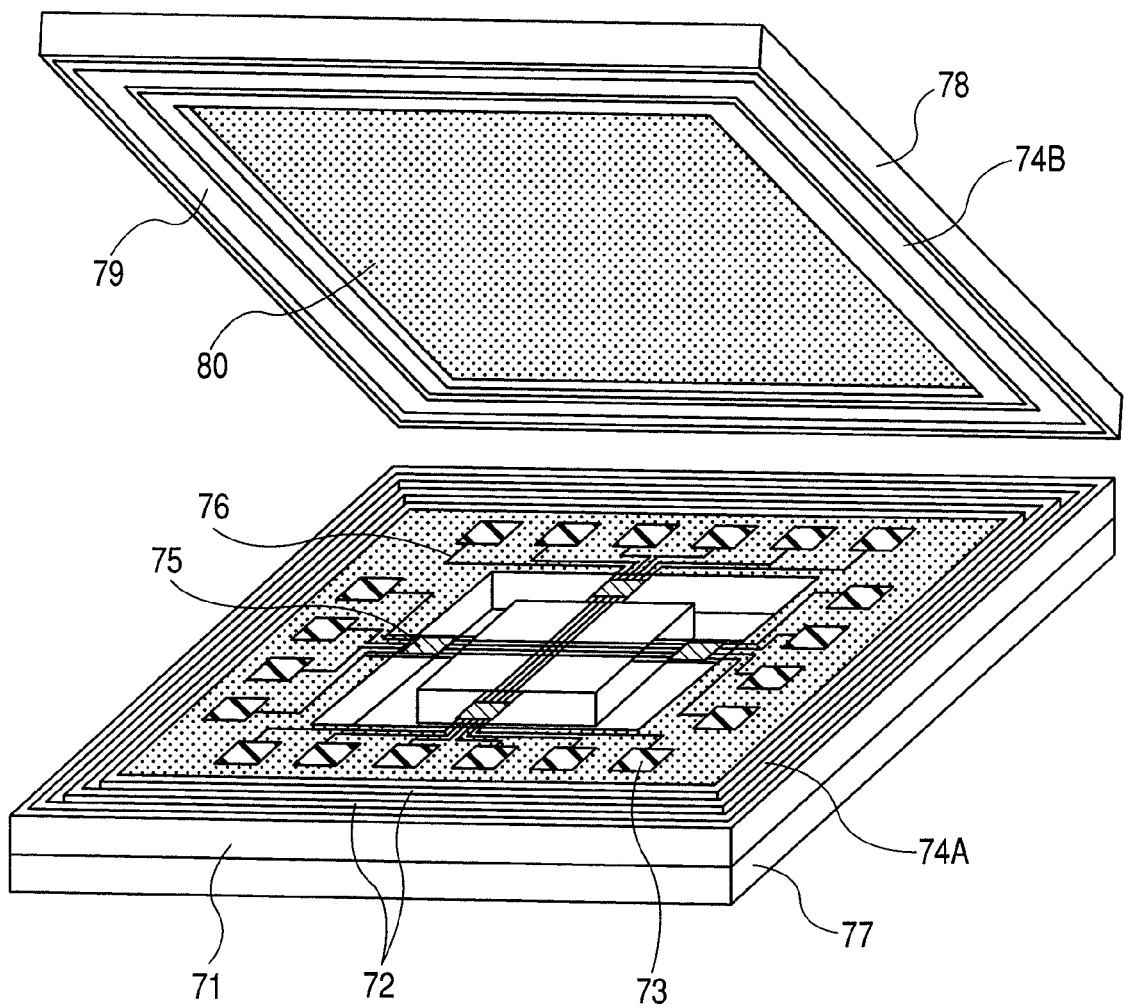
FIG. 5 is a schematic view of a piece of MEMS functional devices (acceleration sensor) according to another embodiment of the invention.
Figure 6A:
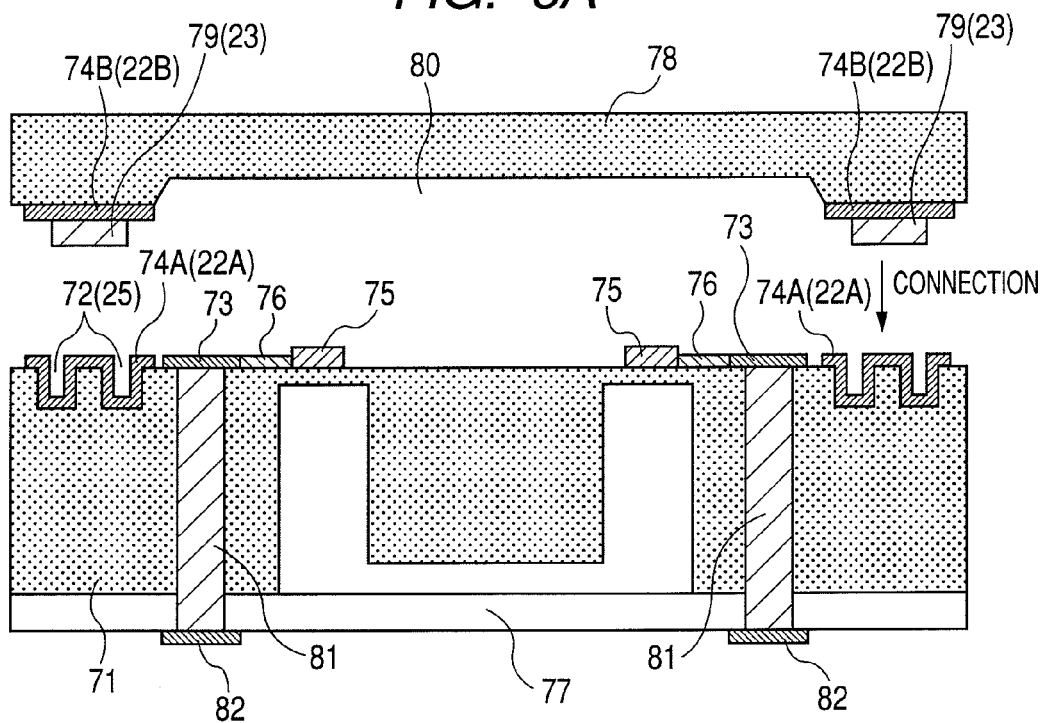
FIGS. 6A and 6B are views showing a cross-sectional structure of a piece of the MEMS functional devices (acceleration sensor) according to the embodiment of the invention.
Figure 6B:
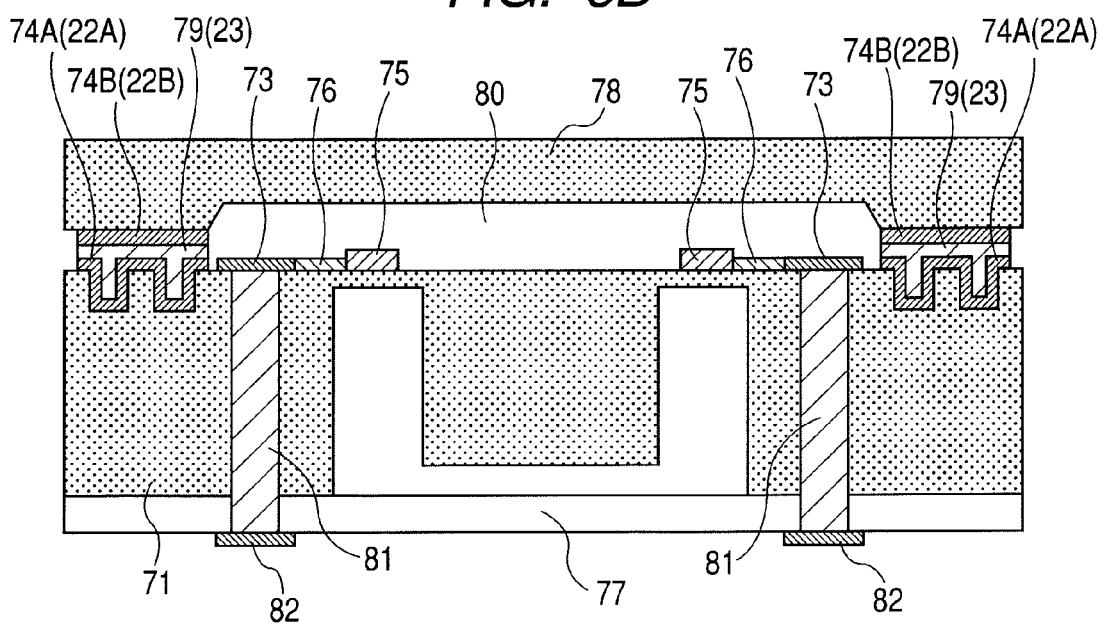

Embodiment 4 of the invention is to be described with reference to FIG. 5 and FIGS. 6A and 6B. In this embodiment, an MEMS functional device package for various kinds of sensors, actuators, high frequency filters, and mirror functional devices, etc. to which the previous sealing structures are applied is to be described. For example, in an acceleration sensor, a structure including a weight is generally formed by using an etching technique, and acceleration that exerts on the weight can be read by reading an electrostatic capacitance change in an electrode connected to the weight or a resistance change of a strain detection device formed on a thin beam connected to the weight. FIG. 5 is a schematic view of one piece of piezo-resistive-type 3-axis acceleration sensors using an SOI wafer, and FIGS. 6A and 6B are view showing a cross sectional structure thereof. Since the operation principle of the piezo-resistive-type acceleration sensor and conventional mounting structures are described in a number of literatures, they are not described here.

Concave portions 72 (25) are formed in two rows on an SOI substrate 71, on which metallization 74A (22A) is formed. Piezo elements 75 and wirings 76 are formed at positions inside of the concave portions 72 (25) on the SOI substrate 71. Further, a glass substrate 77 is connected to the lower surface of the SOI substrate 71.

On the other substrate, i.e., an Si cap substrate 78, a solder film 79 (23) is formed on metallization 74B (22B), and a cavity 80 is also formed.

FIGS. 6A and 6B show the cross-sectional structure thereof in which electrode metallization 73 connected the wiring 76 is disposed on inside positions of the concave portion 72 (25) (on side of piezo elements 75) on the functional-device-side Si substrate 71. A through electrode 81 is formed underneath the electrode metallization 73, which is connected with an electrode metallization 82. In the same manner as in the previous embodiments, the solder film 79 (23) is forced onto the concave portion 72 (25), and heated in this state to a melting point or higher of the solder whereby connection and hermetic sealing are conducted.

As the structure for the hermetic seal portion, any of the structures described in Embodiment 1 to Embodiment 3 can be applied.

As has been described above, according to this embodiment, since reliable hermetic sealing can be conducted collectively in a wafer state, a functional device package of high reliability, small in size and at a low cost can be attained.

Embodiment 5

Figure 7A:
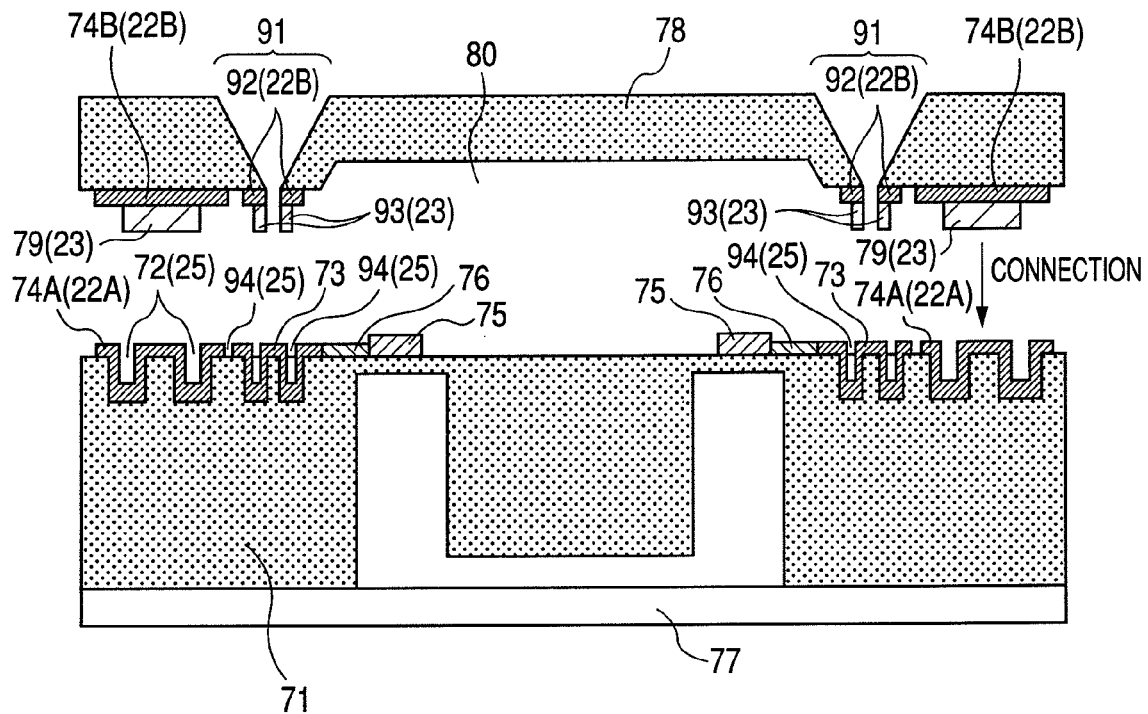
FIGS. 7A and 7B are view showing a cross sectional structure of a piece of the MEMS functional devices (acceleration sensor) according to another embodiment of the invention.
Figure 7B:
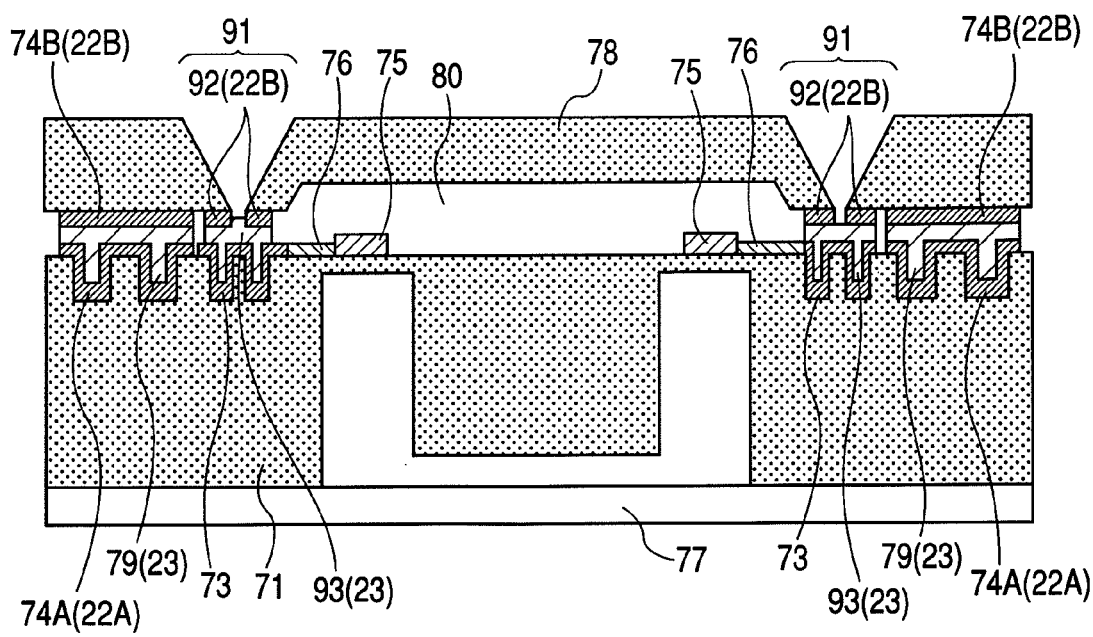

Embodiment 5 of the invention is to be described with reference to FIGS. 7A and 7B. It is a view showing a cross-sectional structure of one piece of the MEMS functional devices (acceleration sensor) according to this embodiment. The embodiment relates to a structure not requiring the through electrode 81 formed in the Embodiment 4. Identical reference numerals with those in FIGS. 6A and 6B denote identical constituent elements, and description is omitted for a portion of them for the sake of simplicity.

A through hole 91 is formed on the Si cap substrate 78 by using a method such as etching, sandblasting, and laser processing. On the lower surface of the Si cap substrate 78, that is, on the side of the connection surface, the periphery of the through hole 91 is surrounded by an electrode metallization 92 (22B) on which a solder film 93 (23) is also formed. This is connected with the electrode metallization 73 connected by way of the wiring 76 to the piezo element 75.

The electrode metallization 73 (22A) is disposed on an inner surface of concave portions 94 (25) (on the side of piezo element 75) on the functional-device-side Si substrate 71. Since the electrode metallization 73 (22A) is formed in a concave shape in advance, a solder connection for hermetic sealing at a high yield can be conducted also between the electrode metallization 92 (22B) and the electrode metallization 73 (22A) by the solder spreading in a wet state and formation of the fillet, as described in the previous embodiments. Like Embodiment 4, any of the structures of Embodiments 1 to 3 can be applied. Namely, in the Si cap substrate 78, the metallization 74B (22A) can be applied on the surface of the concave portion (25) provided at a position opposed to the metallization 74A (22B) on the functional-device-side Si substrate 71, and the electrode metallization 92 (22A) can be covered at least a surface of a continuous concave portion (not shown) surrounding the through hole 91 as shown in FIGS. 3A-3D.

In addition to the effect of Embodiment 4, the effect to be obtained in this embodiment is first that the process of machining the through hole on the Si substrate 71 on which the functional device is formed becomes unnecessary. Accordingly, since the thickness of the Si cap substrate 78 can be made smaller than the Si substrate 71 on which the functional device is formed, machining the through hole can be performed with greater ease compared with Embodiment 4. Further, when a deep hole is to be formed, since the hole generally becomes smaller with increase in its depth, a somewhat large opening portion is necessary. In this embodiment where the through hole is shallow, since the diameter of the opening portion of the through hole can be decreased, it is also advantageous to further miniaturization.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A functional device package including:
   a functional device;
   a first Si substrate including a surface in which a plurality of concave portions are formed, wherein metallization is applied on internal surfaces of each of said concave portions; and
   a second Si substrate to which metallization is applied at a position opposed to the concave portions,
   wherein an area outside of the plural concave portions and between the plural concave portions on the surface of the first Si substrate in which the plural concave portions are formed is applied with metallization which is electrically connected to the metallization applied to the internal surfaces of each of the plural concave portions, and
   wherein the metallization applied to the area of the surface of the first Si substrate between the concave portions and to the internal surfaces of the concave portions formed on the first Si substrate and the metallization applied at the portions of the second Si substrate opposed to the concave portions are all connected by solder, and the first Si substrate and the second Si substrate are connected so as to hermetically seal the functional device, wherein
   the concave portions are formed in plurality of rows.

2. The functional device package according to claim 1, wherein
   the functional device is formed on the first Si substrate in such a way to be surrounded by the concave portions.

3. The functional device package according to claim 1, wherein
   the functional device is formed on the second Si substrate in such a way to be surrounded by the metallization applied at the position opposed to the concave portions.

4. The functional device package according to claim 1, wherein
   each of the concave portions is a V-shaped groove, and an angular convex portion is formed by lateral sides of adjacent concave portions.

5. The functional device package according to claim 1, wherein
   a depth of each of the concave portions is less than 20 μm.

6. The functional device package according to claim 1, wherein
the solder comprises a solder material containing, as a main ingredient, such an alloy as Au—Sn, Sn—Ag, Sn—Cu, Sn—Ag—Cu, Sn—Zn, Sn—Pb, and Sn—Bi.

7. The functional device package according to claim 1, wherein
the first Si substrate and the second Si substrate are Si wafers or wafers of an Si/SiO$_2$/Si sandwich structure having an SiO$_2$ insulation layer on inside.

8. The functional device package according to claim 1, wherein
metallization is formed outside of the concave portions on the surface of the first Si substrate at second areas of the surface which are not formed between the concave portions, and the metallization formed on the internal surfaces of the concave portions and the metallization formed on outside of the concave portions at the second areas of the surface of the first Si substrate are connected.

9. A functional device package including:
a functional device;
a first Si substrate including a surface in which a plurality of concave portions are formed, wherein metallization is applied on internal surfaces of each of said concave portions; and
a second Si substrate to which metallization is applied at a position opposed to the concave portions,
wherein an area outside of the plural concave portions and between the plural concave portions on the surface of the first Si substrate in which the plural concave portions are formed is applied with metallization which is electrically connected to the metallization applied to the internal surfaces of each of the plural concave portions, and
wherein the metallization applied to the area of the surface of the first Si substrate between the concave portions and to the internal surfaces of the concave portions formed on the first Si substrate and the metallization applied at the portions of the second Si substrate opposed to the concave portions are all connected by solder, and the first Si substrate and the second Si substrate are connected so as to hermetically seal the functional device, wherein
the metallization has a constitution in which a thin film containing at least one of Ni, Cu, Pt, and Pd for suppressing reaction with the solder is formed on the surface of a thin film containing at least one of metals such as Ti, Cr, W and V formed as an adhesion layer with the Si substrate and an Au film for antioxidation is further formed on the surface thereof.

10. A functional device package having a package structure formed by stacking two sheets of Si substrates on either of which a plurality of functional devices are formed, bonding them with solder to conduct hermetical sealing at a wafer level, and then cutting and separating them into individual pieces,
the functional device package comprising:
a functional device;
a first Si substrate on which the functional devices are formed and including a surface in which a plurality of concave portions are formed in continuous rows so as to surround the functional devices, and wherein metallization is applied to internal surfaces of the plural concave portions; and
a second Si substrate which is stacked with the first Si substrate to cover the functional devices formed on the first substrate,
wherein an area outside of the plural concave portions and between the plural concave portions on the surface of the first Si substrate in which the plural concave portions are formed is applied with metallization which is electrically connected to the metallization applied to the internal surfaces of each of the plural concave portions, and
wherein the metallization applied to the area of the surface of the first Si substrate between the concave portions and to the internal surfaces of the concave portions formed on the first Si substrate and metallization applied at the portions of the second Si substrate opposed to the concave portions are all connected by solder, and the first Si substrate and the second Si substrate are connected so as to hermetically seal the functional device.

11. A functional device package including:
a functional device;
a first Si substrate including a surface in which a plurality of concave portions are formed, wherein metallization is applied on internal surfaces of each of said concave portions; and
a second Si substrate to which metallization is applied at a position opposed to the concave portions,
wherein an area outside of the plural concave portions and between the plural concave portions on the surface of the first Si substrate in which the plural concave portions are formed is applied with metallization which is electrically connected to the metallization applied to the internal surfaces of each of the plural concave portions, and
wherein the metallization applied to the area of the surface of the first Si substrate between the concave portions and to the internal surfaces of the concave portions formed on the first Si substrate and the metallization applied at the portions of the second Si substrate opposed to the concave portions are all connected by solder, and the first Si substrate and the second Si substrate are connected so as to hermetically seal the functional device,
wherein
metallization is formed outside of the concave portions on the surface of the first Si substrate at second areas of the surface which are not formed between the concave portions, and the metallization formed on the internal surfaces of the concave portions and the metallization formed on outside of the concave portions at the second areas of the surface of the first Si substrate are connected, and
wherein
the metallization on the internal surfaces of the concave portions of the first Si substrate, the metallization outside of the concave portions at the second areas of the first Si substrate, and the metallization applied at the position of the second Si substrate opposed to the concave portion are connected to each other by melting solder, and the first Si substrate and the second Si substrate are connected so as to hermetically seal the functional device.

* * * * *